United States Patent
Kawakubo et al.

(10) Patent No.: US 7,769,352 B2
(45) Date of Patent: Aug. 3, 2010

(54) RECEIVER AND WIRELESS COMMUNICATION APPARATUS

(75) Inventors: Takashi Kawakubo, Yokohama (JP); Toshihiko Nagano, Kawasaki (JP); Kazuhide Abe, Kawasaki (JP); Michihiko Nishigaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 870 days.

(21) Appl. No.: 11/568,365

(22) PCT Filed: Sep. 25, 2006

(86) PCT No.: PCT/JP2006/319612
§ 371 (c)(1),
(2), (4) Date: Mar. 12, 2010

(87) PCT Pub. No.: WO2007/035000
PCT Pub. Date: Mar. 29, 2007

(65) Prior Publication Data
US 2008/0254756 A1 Oct. 16, 2008

(30) Foreign Application Priority Data
Sep. 26, 2005 (JP) ............................. 2005-278015

(51) Int. Cl.
H04B 1/40 (2006.01)
H04B 7/00 (2006.01)
H04L 27/22 (2006.01)

(52) U.S. Cl. ............................. 455/75; 455/76; 455/86; 455/208; 455/265; 455/318; 329/302; 329/307

(58) Field of Classification Search .................. 455/75, 455/76, 85, 86, 131, 208, 255, 265, 318; 329/302, 307, 358
See application file for complete search history.

(56) References Cited

U.S. PATENT DOCUMENTS

| 4,310,804 | A | * | 1/1982 | Ryon | .......................... 331/1 A |
| 4,387,342 | A | | 6/1983 | Grosjean | |
| 5,406,218 | A | * | 4/1995 | Ishihara et al. | .............. 329/346 |
| 5,412,694 | A | * | 5/1995 | Sato et al. | .................... 375/330 |
| 5,438,591 | A | * | 8/1995 | Oie et al. | ..................... 375/261 |
| 5,535,252 | A | * | 7/1996 | Kobayashi | .................. 375/371 |
| 5,966,444 | A | * | 10/1999 | Yuan et al. | .................. 380/283 |

(Continued)

FOREIGN PATENT DOCUMENTS

EP 0 297 774 A2 1/1989

(Continued)

Primary Examiner—Duc M Nguyen
(74) Attorney, Agent, or Firm—Oblon, Spivak, McClelland, Maier & Neustadt, L.L.P.

(57) ABSTRACT

A receiver has a first voltage control oscillator configured to generate a first oscillation signal, a second voltage control oscillator configured to generate a second oscillation signal having a first phase, a first phase comparator configured to detect a phase difference between the first and second oscillation signals, a demodulator configured to perform demodulation processing of the received signal and to generate timing information of a second phase included in the first oscillation signal, a second phase comparator configured to detect the phase difference between the first and second oscillation signals, and a first control voltage generator configured to generate a first control voltage for controlling a phase and a frequency of the second voltage control oscillator based on the phase difference detected by the second phase comparator.

18 Claims, 5 Drawing Sheets

U.S. PATENT DOCUMENTS 6,993,100 B2 * 1/2006 Yang et al. .................. 375/342
7,449,945 B2 * 11/2008 Kawakubo et al. .......... 329/345
2006/0132229 A1 6/2006 Kawakubo et al.

FOREIGN PATENT DOCUMENTS

EP 0 557 867 A2 9/1993
JP 10-136045 5/1998

* cited by examiner

RECEIVER AND WIRELESS COMMUNICATION APPARATUS

BACKGROUND OF THE INVENTION

1. Field of the Invention

The present invention relates to a wireless communication apparatus having a receiver which demodulates a phase-modulated received signal and a transmitter which transmits a phase modulation signal to the receiver.

2. Related Art

In a mobile wireless communication field such as a portable phone, there have been proposed many kinds of radio frequency transmission/reception schemes. One of their schemes is a superheterodyne scheme which has been practically used from a long time ago. In the superheterodyne scheme, the received radio frequency signal is converted into an intermediate frequency signal, and then a certain channel frequency signal is selected to perform quadrature demodulation. The quadrature-demodulated signal passes through a low pass filter and an A/D converter in sequence to perform the respective processings, and then is demodulated.

Recently, a mainstream scheme in a GSM cellular phone system and the like is a direct conversion scheme (see Japanese Patent Laid-Open. Pub. No. 136045/1998). In this scheme, the received signal passes through a radio frequency bandwidth filter, and then is separated into two paths. Subsequently, the separated signals are mixed with local oscillation signals having phases orthogonal to each other by a quadrature demodulator to generate a baseband signal. The baseband signal passes through the low pass filter and the A/D converter before being demodulated. The transmitted signal is dealt with processings contrary to the received signal.

Both of the superheterodyne scheme and the direct conversion scheme have to perform the processing of converting the radio frequency signal generated by a local oscillator into the intermediate frequency, the quadrature demodulation processing, the demodulation processing after A/D conversion and the like. Therefore, configuration of the system is complicated.

In order to generate the local oscillation signal, some components such as a TCXO (Temperature Compensated Crystal Oscillator) have to be externally attached. Therefore, downsizing is difficult and a cost of components becomes expensive.

As a future wireless system, there has been proposed a system in which A/D conversion is performed by an oversampling scheme directly using a carrier wave frequency to select and demodulate the channel signal by digital processing.

However, in an extremely high carrier wave frequency such as 800 MHz to 2 GHz used by the cellular phone, an extremely high-speed A/D converter has to be provided to perform A/D conversion by the oversampling. Therefore, power consumption increases more than several dozen watts and it is difficult to practically develop such an A/D converter in the near future.

SUMMARY OF THE INVENTION

In order to solve the above-described problem, an object of the present invention is to provide a receiver and a wireless communication apparatus which can simplify internal configuration's and reduce power consumption and a cost of parts, in which downsizing is possible.

According to one embodiment of the present invention, a receiver, comprising:

a first voltage control oscillator configured to select a certain frequency component included in a phase-modulated received signal to generate a first oscillation signal;

a second voltage control oscillator configured to generate a second oscillation signal having a first phase;

a first phase comparator configured to detect a phase difference between the first and second oscillation signals;

a demodulator configured to perform demodulation processing of the received signal based on the phase difference detected by the first phase comparator and to generate timing information of a second phase included in the first oscillation signal;

a second phase comparator configured to extract the second phase component included in the first oscillation signal based on the timing information generate by the demodulator to detect the phase difference between the first and second oscillation signals; and a first control voltage generator configured to generate a first control voltage for controlling a phase and a frequency of the second voltage control oscillator based on the phase difference detected by the second phase comparator.

According to one embodiment of the present invention, a wireless communication apparatus, comprising:

a receiver configure to receive a phase-modulated received signal; and a transmitter configured to transmit a phase-modulated transmission signal, wherein the receiver includes:

a first voltage control oscillator configured to select a certain frequency component included in the received signal to generate a first oscillation signal;

a second voltage control oscillator configured to generate a second oscillation signal having a first phase;

a first phase comparator configured to detect a phase difference between the first and second oscillation signals;

a demodulator configured to perform demodulation processing of the received signal based on the phase difference detected by the first phase comparator, and to generate timing information of a second phase included in the first oscillation signal;

a second phase comparator configured to extract a second phase component included in the first oscillation signal based on the timing information generated by the demodulator to detect the phase difference between the first and second oscillation signals; and a first control voltage generator configured to generate a first control voltage for controlling a phase and a frequency of the second voltage control oscillator based on the phase difference detected by the second phase comparator, wherein the transmitter includes:

a modulator configured to generate a modulation signal for transmission;

a D/A converter configured to convert the modulation signal into analog modulation data;

a third voltage control oscillator configured to generate a phase-modulated third oscillation signal based on the analog modulation data;

a third phase comparator configured to detect a phase difference between the third oscillation signal and the second oscillation signal;

an adder configured to add a signal indicative of the phase difference detected by the third comparator to the digital modulation data to generate phase modulation data; and a third control voltage generator configured to generate a third control voltage for controlling a phase and a frequency of the third oscillation signal based on an output signal of the adder.

DETAILED DESCRIPTION OF THE INVENTION

Hereafter, embodiments according to the present invention will be described more specifically with reference to the drawings.

First Embodiment

Figure 1:
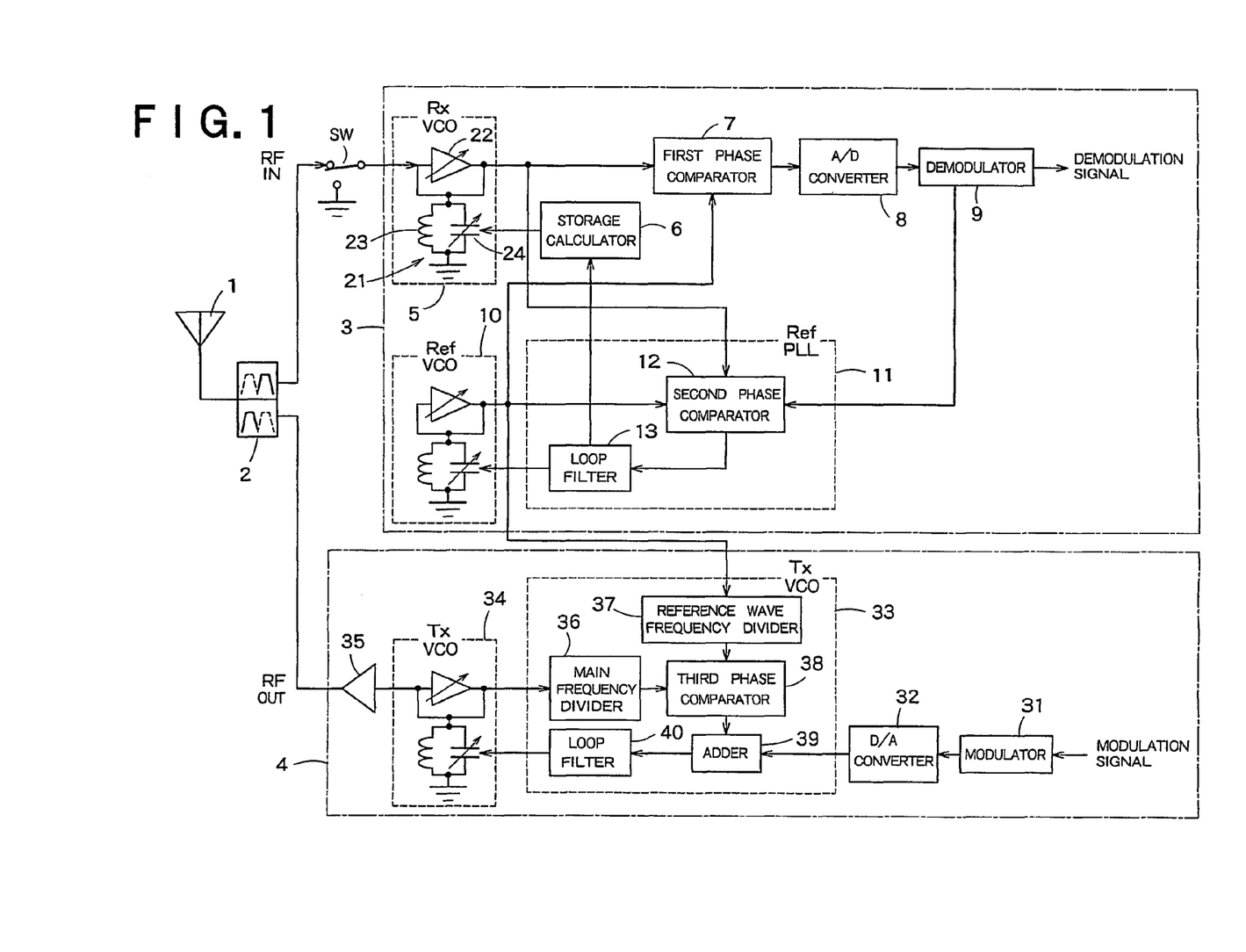
FIG. 1 is a block diagram showing schematic configuration of a wireless communication apparatus according to a first embodiment of the present invention.

FIG. 1 is a block diagram showing schematic configuration of a wireless communication apparatus according to a first embodiment of the present invention. The wireless communication apparatus of FIG. 1 performs phase modulation/demodulation.

The wireless communication apparatus of FIG. 1 has an antenna 1, a duplexer 2 which separates a transmitted signal from a received signal, a receiver 3 and a transmitter 4. The receiver 3 has a first voltage control oscillator (Rx-VCO) 5, a storage calculator (second control voltage generator) 6, a first phase comparator 7, an A/D converter 8, a demodulator 9, a second voltage control oscillator (Ref-VCO) 10 and a first PLL circuit (Ref-PLL) 11. The Ref-PLL 11 has a second phase comparator 12 and a loop filter (first control voltage generator) 13.

The Rx-VCO 5 selects a certain frequency component included in a phase-modulated received signal to generate a first oscillation signal. The Rx-VCO 5 has a tank circuit 21 capable of variably changing a resonance frequency and an amplifier 22 which amplifies an oscillation signal (first oscillation signal) of the tank circuit 21. The tank circuit 21 has an inductor 23 and a variable capacitor 24 which are connected in parallel.

The capacitance of the variable capacitor 24 is controlled by, for example, a piezoelectric-driven MEMS (Micro Electrical-Mechanical System) actuator. The piezoelectric-driven MEMS actuator has a variable capacitance range of 10 or more times as much as ordinary variable capacitances and a Q value of 50 or more. Therefore, if the tank circuit 21 is provided with the piezoelectric-driven MEMS actuator, a variable frequency range of three or more times as much as that of the ordinary variable capacitor is obtained, and more excellent frequency selection performance than that of the ordinary variable capacitor is obtained.

As described above, since the Rx-VCO 5 embeds the piezoelectric-driven MEMS, it is possible to generate the oscillation signal of wide frequency bandwidth. The Ref-VCO 10 is also constituted in the same way as that of the Rx-VCO 5.

The capacitance of the variable capacitor 24 is controlled by an output voltage of the storage calculator 6. When the capacitance of the variable capacitor 24 changes, the resonance frequency of the tank circuit 21 changes together, thereby changing the frequency of the first oscillation signal. As a result, the Rx-VCO 5 is controlled so that the frequency becomes constant by controlling the output voltage of the storage calculator 6.

The first phase comparator 7 detects a phase difference between a first oscillation signal generated by the Rx-VCO 5 and a second oscillation signal generated by the Ref-VCO 10. The phase of the second oscillation signal is always constant. Therefore, it is possible to extract a phase difference included in the received signal, i.e. a phase modulation component, based on the phase difference detected by the first phase comparator 7.

The phase difference signal detected by the first phase comparator 7 is converted into a digital signal by the A/D converter 8, and the digital signal is inputted to the demodulator 9. The demodulator 9 performs phase determination of the phase-modulated received signal to perform the demodulation processing. The demodulator 9 supplies timing information of a certain phase, for example, phase 0, to the second phase comparator 12 based on a result of the phase determination.

The second phase comparator 12 extracts only a certain phase component included in a first oscillation signal based on timing information of a certain phase supplied from the demodulator 9. For example, when the phase of the second oscillation signal is 0, the demodulator 9 supplies a timing of phase 0 to the second phase comparator 12. The second phase comparator 12 extracts only a component of phase 0 included in the first oscillation signal to detect a phase difference between the extracted signal and the second oscillation signal. The detected phase difference is inputted to the loop filter 13 to eliminate unnecessary frequency component.

The Ref-VCO 10 has a tank circuit 21 having a variable capacitor 24. The capacitance of the variable capacitor 24 is controlled by the output voltage of the loop filter 13. With such a control, the Ref-VCO 10 controls the frequency and the phase of the second oscillation signal in accordance with the phase difference between the first and second oscillation signals at a certain phase. Therefore, the second oscillation signal is controlled so as to have a certain phase and a certain frequency.

In this way, the first phase comparator 7 detects the phase difference by using the second oscillation signal having a certain phase and a certain frequency as a reference signal. Therefore, it is possible to accurately tune the phase and the frequency of the first oscillation signal. Once the phase and the frequency of the first oscillation signal are tuned, the first phase comparator 7 continuously detects the phase difference. Based on the detected result, the A/D converter 8, the demodulator 9, the Ref-PLL 11 and the storage calculator 6 continuously control the Rx-VCO 5 and the Ref-VCO 10. Therefore, the first and second oscillation signal is locked to desirable phase and frequency.

The output of the loop filter 13 is inputted to the storage calculator 6. The storage calculator 6 has a table indicative of a relationship between the phase difference detected by the second phase comparator 12 and a setting voltage of the variable capacitor 24 in the Rx-VCO 5. The table registers information relating to the setting voltages necessary for holding the frequency of the first oscillation signal to be constant.

When the phase difference signal is inputted from the loop filter 13 to the storage calculator 6, the setting voltage corresponding to the phase difference signal is read out from the storage calculator 6 to supply the voltage to the Rx-VCO 5. Therefore, the Rx-VCO 5, performs frequency control so that the first oscillation signal becomes a certain frequency.

On the other hand, the transmitter 4 has a modulator 31, a D/A converter 32, a second PLL circuit (Tx-PLL) 33, a third voltage control oscillator (Tx-VCO) 34 and a power amplifier 35. The Tx-PLL 33 has a main frequency divider 36, a reference wave frequency divider 37, a third phase comparator 38, an adder 39 and a loop filter 40. The Tx-VCO 34 is constituted in the same way as that of the Rx-VCO 5.

The third phase comparator 38 detects a phase difference between a frequency divided signal obtained by dividing the third oscillation signal generated by the Tx-VCO 34 with the main frequency divider 36 and a frequency divided signal obtained by dividing the second oscillation signal generated by the Ref-VCO 10 with the reference wave frequency divider 37. The phase difference signal is inputted to the adder 39.

A digital modulation signal obtained by A/D-converting the modulation signal generated by the modulator 31 with the D/A converter 32 is inputted to the adder 39. The adder 39 generates the phase modulation signal obtained by adding the phase difference signal to the digital modulation signal and supplies the phase modulation signal to the loop filter 40. The loop filter 40 generates a control voltage obtained by eliminating signal component of unnecessary frequency bandwidth from the phase modulation signal, and supplies the control voltage to the Tx-VCO 34.

The Tx-VCO 34 controls the phase and the frequency of the third oscillation signal based on the control voltage generated by the loop filter 40. More specifically, the Tx-VCO 34 controls the phase and the frequency of the third oscillation signal so that the phase of the third oscillation signal becomes constant within the baseband cycle, and the third oscillation signal is locked to the subsequent phase at a moment when the baseband cycle changes. The third oscillation signal is amplified by the power amplifier 35, and then is transmitted to the antenna 1 via the duplexer 2.

Figure 2:
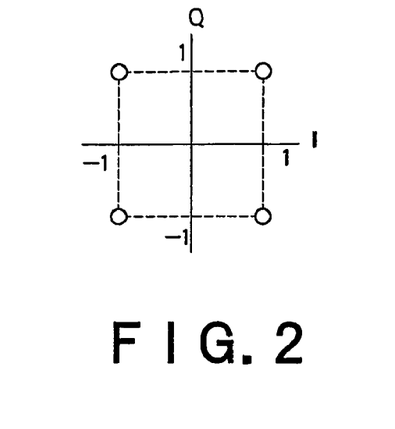
FIG. 2 is a diagram explaining I signal and Q signal of orthogonal coordinates.
Figure 3:
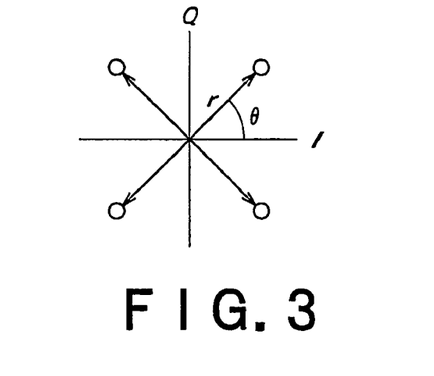
FIG. 3 is a diagram explaining θ signal and r signal of polar coordinates.
Figure 4:
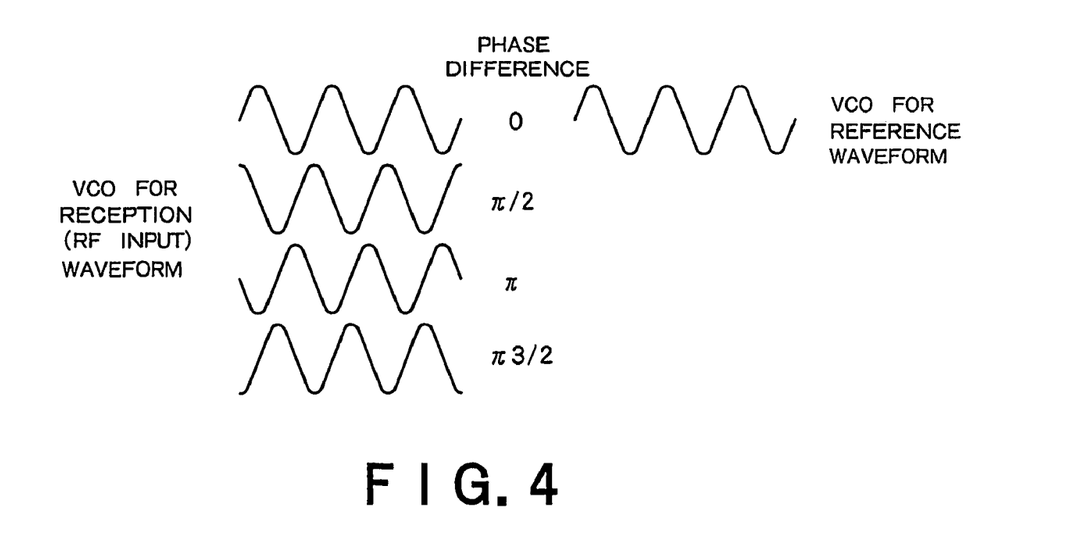
FIG. 4 is a diagram showing one example of a waveform of θ signal.

Next, operation of the wireless communication apparatus in FIG. 1 will be described hereinafter. The wireless communication apparatus according to the present embodiment performs the phase modulation and the phase demodulation, and is also called as a polar modulator 9 and a polar demodulator 31, respectively. First of all, operational principles of the polar modulator 9 and the polar demodulator 31 will be described by using a QPSK (Quadrature Phase Shift Keying) as one example, which is used for the cellular phone and the like. In QPSK, as shown in FIG. 4, the phase of the carrier wave frequency is modulated to one of four values, i.e. 0, $\pi/2$, $\pi$, $3\pi/2$, in accordance with the baseband signal. In the conventional quadrature demodulation scheme, the phase modulation signal having four values is replaced with I and Q components of orthogonal coordinates as shown in FIG. 2. The modulation and the demodulation are performed based on the amplitudes of the I and Q components. On the other hand, in the polar modulation and the polar demodulation, as shown in FIG. 3, the phase modulation signal having four values is directly replaced with θ signal having four values. The amplitude component "r" is controlled to narrow the bandwidth at the modulation time.

The received signal received by the antenna 1 of FIG. 1 is inputted to the Rx-VCO 5 tuned so as to oscillate at the same frequency as a certain channel frequency of the carrier wave, and oscillating operation is performed while holding the phase information to generate the first oscillation signal. On the other hand, the second oscillation signal generated by the Ref-VCO 10 is a reference signal synchronously fixed to a certain phase.

Figure 5:
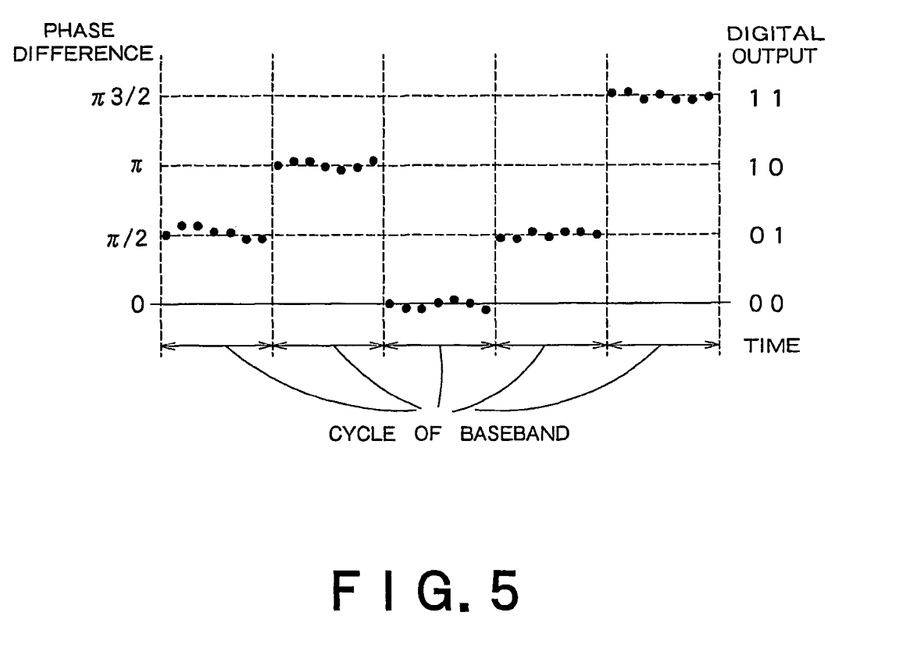
FIG. 5 is a diagram showing a relationship between a switching timing of phase difference and a digital signal.

The first phase comparator 7 performs phase comparison between the first oscillation signal and the second oscillation signal (reference signal) to generate the phase difference signal. FIG. 5 is a diagram showing one example of the phase difference signal. As shown in FIG. 5, there are four types of the phase differences, i.e. $3\pi/2$, $\pi$, $\pi/2$ and 0. The phase difference is switched for each baseband cycle.

The first phase comparator 7 does not have to perform the phase comparison at the same frequency as the carrier wave frequency of the received signal, but may perform the phase comparison at a lower frequency than the frequency of the received signal. The first phase comparator 7 has to perform the phase comparison at a higher frequency than the frequency of the baseband. Therefore, it is possible to lower the frequency at stages subsequent to the first phase comparator 7 in the receiver 3, thereby simplifying a circuit configuration and not being easily affected by noise.

The A/D converter 8 converts the phase difference signal detected by the first phase comparator 7 into the digital signal having four values. For example, as shown in FIG. 5, the phase difference $3\pi/2$ is converted into 11, $\pi$ is converted into 10, $\pi/2$ is converted into 01 and 0 is converted into 00. Since the phase difference signal directly corresponds to the modulation signal, the digital signal itself expresses the modulation signal. Therefore, the demodulator 9 can easily perform the demodulation processing. That is, the demodulator 9 acknowledges as the modulated signal if there is a variation of the phase difference between the baseband cycles, and performs the demodulation processing.

The Rx-VCO 5 may continuously perform the oscillating operation, or may intermittently perform the oscillating operation. When the oscillating operation is continuously performed, loop gain of the Rx-VCO 5 is set to 1 or a value slightly less than 1, and the received signal is continuously oscillated on a condition that a self oscillation does not occur. When the oscillating operation is intermittently performed, the loop gain of the Rx-VCO 5 is set to a value larger than 1, and the received signal is intermittently inputted and oscillated at a timing when a frequency larger than the frequency of the baseband signal is obtained. In this case, as shown in FIG. 1, a switch SW may be provided between the input terminal of the Rx-VCO 5 and the duplexer 2, and this switch SW may be turned on/off to intermittently input the received signal.

As described above, according to the first embodiment, there are provided the Rx-VCO 5 which generates the first oscillation signal for oscillating at a certain frequency included in the received signal and the Ref-VCO 10 which generates the second oscillation signal for reference. At a state of fixing the phase of the second oscillation signal, the phase difference between the first and second oscillation signals is detected to perform the demodulation processing. Therefore, a local oscillator, a mixer, a quadrature demodulator and the like are unnecessary, thereby largely simplifying internal configuration. The phase difference between the first and second oscillation signals can be detected at a longer cycle than a cycle of the received signal. It is possible to lower the operational frequency at stages subsequent to the first phase comparator 7, thereby simplifying the circuit configuration and not being easily affected by noise.

Second Embodiment

In a second embodiment, operation of the Ref-PLL 11a in the receiver 3 is different from that of the first embodiment.

Figure 6:
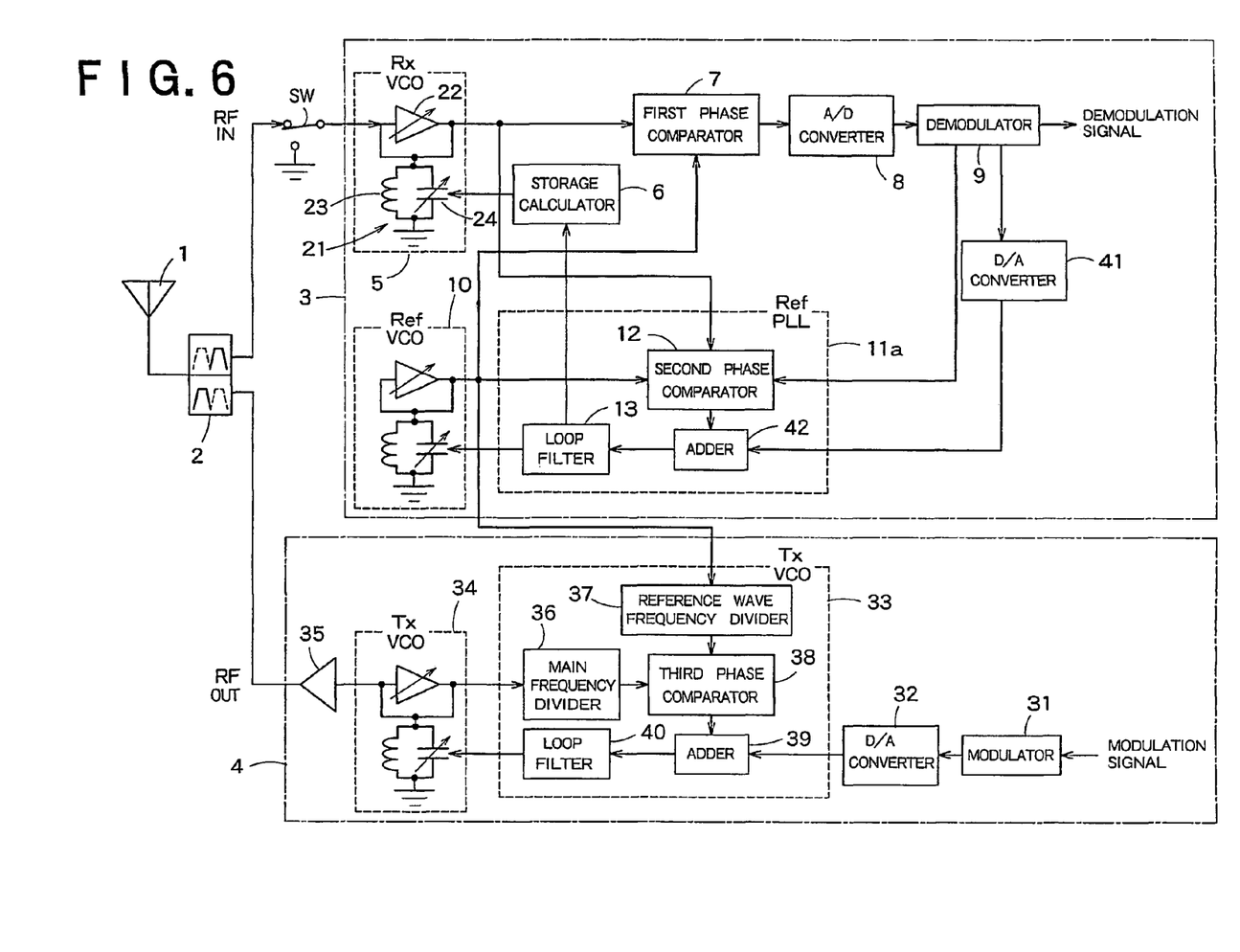
FIG. 6 is a block diagram showing schematic configuration of a wireless communication apparatus according to a second embodiment.

FIG. 6 is a block diagram showing schematic configuration of a wireless communication apparatus according to the second embodiment of the present invention. In FIG. 6, the same reference numerals are attached to constituents common to those in FIG. 1. Hereinafter, points different from FIG. 1 will be mainly described.

The receiver 3 in the wireless communication apparatus of FIG. 6 has a Ref-PLL 11a having a different configuration from that of FIG. 1. In addition to that, the receiver 3 of FIG. 6 has a D/A converter 41 which converts phase information obtained by determining the phase by the demodulator 9 into an analog signal. The D/A converter 41 outputs voltages corresponding to four types of phase differences.

In the first embodiment, the demodulator 9 of FIG. 1 outputs the timing information having the same phase as the phase of the second oscillation signal. The second embodiment assumes that the demodulator 9 of FIG. 6 outputs the timing information of a certain phase such as phase π/2 different from the phase of the second oscillation signal such as phase 0.

The Ref-PLL 11a has an adder 42 in addition to the second phase comparator 12 and the loop filter 13. The second phase comparator 12 according to the first embodiment detects the phase difference between the first and second oscillation signals with respect to a certain phase. The second phase comparator according to the second embodiment detects the phase difference between the first and second oscillation signals, regardless of the phase of the first oscillation signal. Therefore, when the phases of the oscillation signals are different from each other, a displacement of the phases is added and outputted. Therefore, the adder 42 is provided to cancel the displacement of the phases of the first and second oscillation signals. As a result, similarly to the first embodiment, the phase difference between the first and second oscillation signals, for example, phase 0, is detected.

For example, it is assumed that the phase of the second oscillation signal is 0, and the demodulator 9 outputs the timing information of the phase π/2. In this case, the second phase comparator 12 extracts the component of the phase π/2 included in the first oscillation signal to detect the phase difference. Therefore, the phase difference detected by the second phase comparator 12 becomes π/2. The D/A converter 41 generates the phase difference signal of the phase (−π/2) in advance based on the output of the demodulator 9, and the adder 39 adds the output of the second phase comparator 12 to the output of the D/A converter 41. Therefore, the signal having the phase difference 0 similar to the output of the second phase comparator 12 is generated.

As described above, according to the second embodiment, there is no need that the second phase comparator 12 compares the phase difference between the first and second oscillation signals in tune with a certain timing when a certain phase appears. Therefore, timing control is easier than that of the first embodiment. That is, according to the second embodiment, when the second phase comparator 12 performs phase comparison, even if the phase of the first oscillation signal and the phase of the second oscillation signal are different from each other, it is possible to perform a tuning of the phase and the frequency of the first oscillation signal, and a tuning of the phase and the frequency of the second oscillation signal without causing any disadvantage.

The configuration according to the second embodiment except for the above descriptions is the same as that of the first embodiment. Therefore, the second embodiment can accurately perform phase modulation and phase demodulation in a simplified configuration, similarly to the first embodiment.

Third Embodiment

The first and second embodiments conform the frequency of the first oscillation signal with the frequency of the second oscillation signal. If it is unnecessary to conform the frequencies of both oscillation signals, it is possible to realize more flexible apparatus. Therefore, a third embodiment assumes that the frequencies of the first and second oscillation signals are different from each other.

Figure 7:
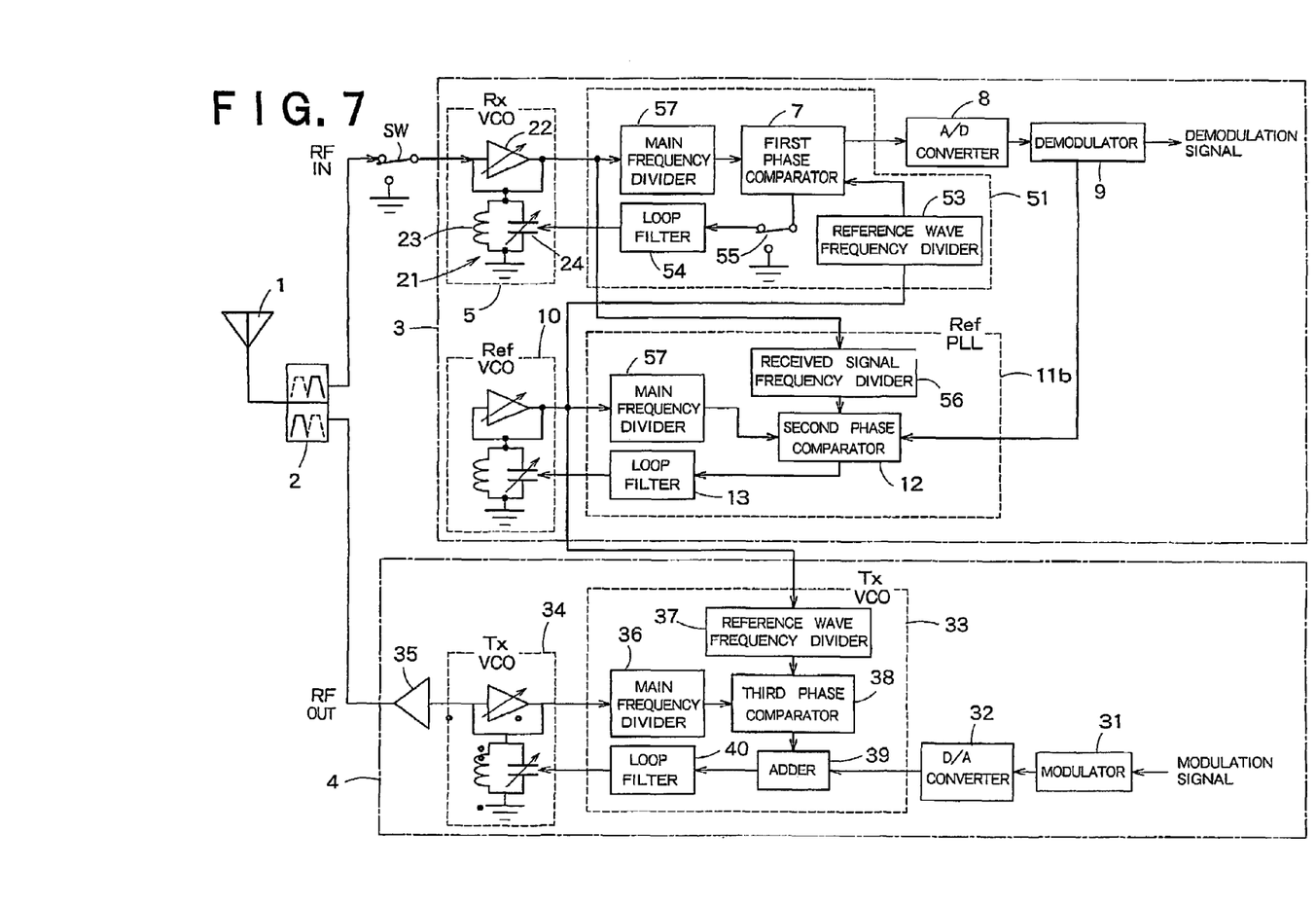
FIG. 7 is a block diagram showing schematic configuration of a wireless communication apparatus according to a third embodiment.

FIG. 7 is a block diagram showing schematic configuration of a wireless communication apparatus according to the third embodiment of the present invention. In FIG. 7, the same reference numerals are attached to constituents common to those in FIG. 1. Hereinafter, points different from FIG. 1 will be mainly described.

The wireless communication apparatus of FIG. 7 has a Ref-PLL 11b having a configuration different from that of FIG. 1 in the receiver 3, and has a receiving PLL circuit 51 which is not provided to the wireless communication apparatus of FIG. 1. The frequency of the first oscillation signal generated by the RX-VCO 5 is different from that of the second oscillation signal generated by the Ref-VCO 10. The configuration of the transmitter 4 is the same as that of FIG. 1.

The receiving PLL circuit 51 has a main frequency divider 52 (first frequency divider) which divides the frequency of the first oscillation signal, a reference wave frequency divider 53 (second frequency divider) which divides the frequency of the second oscillation signal, a first phase comparator 7 which detects a phase difference between a frequency divided signal generated by the main frequency divider 52 and a frequency divided signal generated by the reference wave frequency divider 53, a loop filter 54 which eliminates unnecessary frequency component included in a phase difference signal detected by the first phase comparator 7, and a switch 55 which switches whether to supply the phase difference signal to the loop filter.

A frequency divisional ratio between the main frequency divider 52 and the reference wave divider 53 is set so that the frequency of the frequency divided signal generated by the main frequency divider 52 is equal to the frequency of the frequency divided signal generated by the reference wave divider 53.

The Ref-PLL 11b has a received signal frequency divider 56 which divides the frequency of the first oscillation signal, a main frequency divider 57 which divides the frequency of the second oscillation signal, a second phase comparator 12 which detects a phase difference between the frequency divided signal generated by the received signal frequency divider 56 (third frequency divider) and the frequency divided signal generated by the main frequency divider 57, and a loop filter 13 which eliminates unnecessary frequency component included in the phase difference signal detected by the second phase comparator 12.

A frequency divisional ratio between the received signal frequency divider 56 and the main frequency divider (fourth frequency divider) 57 is set so that the frequency of the frequency divided signal generated by the received signal frequency divider 56 is equal to the frequency divided signal generated by the main frequency divider 57.

In this way, even if the oscillation frequency of the first oscillation signal and the oscillation frequency of the second oscillation signal are different from each other, by adjusting the frequency divisional ratios of the main frequency dividers 52 and 57, the reference wave frequency divider 53 and the received signal frequency divider 56, it is possible to conform the frequencies of the frequency divided signals inputted to the first and second phase comparators 12, and to perform the feedback control similar to the first embodiment.

The switch 55 in the receiving PLL circuit 51 turns on an performs self oscillation when the power of the wireless communication apparatus of FIG. 7 is ON or the apparatus is reset, or the antenna 1 temporarily suspends the received operation. The phase difference signal detected by the first phase comparator 7 is transmitted to the loop filter 54 to perform the feedback control so that the frequency of the first oscillation signal is constant. After that, while the frequency of the first oscillation signal is stable and the first phase comparator 7 performs detection of the phase difference for demodulation processing, the switch is turned off, and feedback control of the first oscillation signal using the phase difference signal is not performed.

The second phase comparator 2, in the Ref-PLL 11b detects the phase difference between the frequency divided signal generated by the received signal frequency divider 56 and the frequency divided signal generated by the main frequency divider 57, and controls the phase and the frequency of the Ref-VCO 10 based on the phase difference signal to set the second oscillation signal to a certain phase.

As described above, according to the third embodiment, the frequencies of the first and second oscillation signals are divided by the frequency dividers and then the phase comparison is performed. Therefore, it is unnecessary to conform the frequencies of the first and second oscillation signals in advance, thereby simplifying configurations of the Rx-VCO 5 and the Ref-VCO 10.

The wireless communication apparatus having the receiver 3 and the transmitter 4 has been described in the above first to third embodiments. The present invention is applicable to a receiver which does not have the transmitter 4. In this case, a received apparatus having the above-described receiver 3 may be provided.

In the above first to third embodiments, internal configurations of the Rx-VCO 5, the Ref-VCO 10 and the Tx-VCO 34 are not limited to the above configurations. If the frequency and the phase are fed back based on the phase difference signal, a specified circuit configuration is not limited.

The invention claimed is:

1. A receiver, comprising:
a first voltage control oscillator configured to select a certain frequency component included in a phase-modulated received signal to generate a first oscillation signal;
a second voltage control oscillator configured to generate a second oscillation signal having a first phase;
a first phase comparator configured to detect a phase difference between the first and second oscillation signals;
a demodulator configured to perform demodulation processing of the received signal based on the phase difference detected by the first phase comparator and to generate timing information of a second phase included in the first oscillation signal;
a second phase comparator configured to extract the second phase component included in the first oscillation signal based on the timing information generate by the demodulator to detect the phase difference between the first and second oscillation signals; and
a first control voltage generator configured to generate a first control voltage for controlling a phase and a frequency of the second voltage control oscillator based on the phase difference detected by the second phase comparator.

2. The receiver according to claim 1, further comprising:
a second control voltage generator configured to generate a second control voltage based on a control information storage unit which stores a relationship between the phase difference detected by the second phase comparator and a control voltage for constantly holding the frequency of the first oscillation signal in advance,
wherein the first voltage control oscillator controls the frequency of the first oscillation signal based on the second control voltage read out from the control information storage unit in accordance with the phase difference detected by the second phase comparator.

3. The receiver according to claim 2,
wherein the first voltage control oscillator has a first tank circuit capable of variably changing a resonance frequency with a second control voltage; and
the second voltage control oscillator has a second tank circuit capable of variably changing a resonance frequency with the first control voltage,
each of the first and second tank circuits including:
an inductor element; and
a variable capacitor actuated by a MEMS (Micro Electrical-Mechanical System) actuator.

4. The receiver according to claim 1,
wherein the second phase comparator detects the phase difference between the first and second oscillation signals for every a predetermined time period based on the timing information.

5. The receiver according to claim 1, further comprising:
an A/D converter configured to convert a signal of the phase difference detected by the first phase comparator into digital data,
wherein the demodulator determines multiple kinds of phases based on the digital data to perform the demodulation.

6. The receiver according to claim 1, further comprising:
a D/A converter configured to convert multiple kinds of phases detected by the demodulator into an analog signal,
wherein the second phase comparator includes:
a phase comparator configured to detect the phase difference between the first and second oscillation signals; and
an adder configured to add the analog signal to a signal indicative of the phase difference detected by the phase comparator to calculate the phase difference between the first and second oscillation signals in the second phase.

7. The receiver according to claim 1, further comprising:
a first frequency divider configured to divide the frequency of the first oscillation signal to generate a first frequency divided signal;
a second frequency divider configured to divide the frequency of the second oscillation signal to generate a second frequency divided signal having the same frequency as that of the first frequency divided signal;
a third frequency divider configured to divide the frequency of the first oscillation signal to generate a third frequency divided signal; and
a fourth frequency divider configured to divide the frequency of the second oscillation signal to generate a fourth frequency divided signal having the same frequency as that of the third frequency divided signal, wherein the first phase comparator detects a phase difference between the first and second frequency divided signals; and the second phase comparator detects a phase difference between the third and fourth frequency divided signals.

8. The receiver according to claim 7, further comprising:
a switching circuit configured to switch whether the phase difference detected by the first phase comparator is supplied to the second control voltage generator.

9. The receiver according to claim 8,
wherein after operation of the first voltage control oscillator is stabilized, the switching circuit shuts down a path between the first phase comparator and the second control voltage generator to prevent the phase difference detected by the first phase comparator from being supplied to the second control voltage generator.

10. A wireless communication apparatus, comprising:
a receiver configure to receive a phase-modulated received signal; and
a transmitter configured to transmit a phase-modulated transmission signal,
wherein the receiver includes:
a first voltage control oscillator configured to select a certain frequency component included in the received signal to generate a first oscillation signal;
a second voltage control oscillator configured to generate a second oscillation signal having a first phase;
a first phase comparator configured to detect a phase difference between the first and second oscillation signals;
a demodulator configured to perform demodulation processing of the received signal based on the phase difference detected by the first phase comparator, and to generate timing information of a second phase included in the first oscillation signal;
a second phase comparator configured to extract a second phase component included in the first oscillation signal based on the timing information generated by the demodulator to detect the phase difference between the first and second oscillation signals; and
a first control voltage generator configured to generate a first control voltage for controlling a phase and a frequency of the second voltage control oscillator based on the phase difference detected by the second phase comparator,
wherein the transmitter includes:
a modulator configured to generate a modulation signal for transmission;
a D/A converter configured to convert the modulation signal into analog modulation data;
a third voltage control oscillator configured to generate a phase-modulated third oscillation signal based on the analog modulation data;
a third phase comparator configured to detect a phase difference between the third oscillation signal and the second oscillation signal;
an adder configured to add a signal indicative of the phase difference detected by the third comparator to the digital modulation data to generate phase modulation data; and
a third control voltage generator configured to generate a third control voltage for controlling a phase and a frequency of the third oscillation signal based on an output signal of the adder.

11. The apparatus according to claim 10, further comprising:

a second control voltage generator configured to generate a second control voltage based on a control information storage unit which stores a relationship between the phase difference detected by the second phase comparator and a control voltage for constantly holding the frequency of the first oscillation signal in advance, wherein the first voltage control oscillator controls the frequency of the first oscillation signal based on the second control voltage read out from the control information storage unit in accordance with the phase difference detected by the second phase comparator.

12. The apparatus according to claim 11,
wherein the first voltage control oscillator has a first tank circuit capable of variably changing a resonance frequency with a second control voltage; and
the second voltage control oscillator has a second tank circuit capable of variably changing a resonance frequency with the first control voltage,
each of the first and second tank circuits including:
an inductor element; and
a variable capacitor actuated by a MEMS (Micro Electrical-Mechanical System) actuator.

13. The apparatus according to claim 10,
wherein the second phase comparator detects the phase difference between the first and second oscillation signals for every a predetermined time period based on the timing information.

14. The apparatus according to claim 10, further comprising:
an A/D converter configured to convert a signal of the phase difference detected by the first phase comparator into digital data,
wherein the demodulator determines multiple kinds of phases based on the digital data to perform the demodulation.

15. The apparatus according to claim 10, further comprising:
a D/A converter configured to convert multiple kinds of phases detected by the demodulator into an analog signal,
wherein the second phase comparator includes:
a phase comparator configured to detect the phase difference between the first and second oscillation signals; and
an adder configured to add the analog signal to a signal indicative of the phase difference detected by the phase comparator to calculate the phase difference between the first and second oscillation signals in the second phase.

16. The apparatus according to claim 10, further comprising:
a first frequency divider configured to divide the frequency of the first oscillation signal to generate a first frequency divided signal;
a second frequency divider configured to divide the frequency of the second oscillation signal to generate a second frequency divided signal having the same frequency as that of the first frequency divided signal;
a third frequency divider configured to divide the frequency of the first oscillation signal to generate a third frequency divided signal; and
a fourth frequency divider configured to divide the frequency of the second oscillation signal to generate a fourth frequency divided signal having the same frequency as that of the third frequency divided signal, wherein the first phase comparator detects a phase difference between the first and second frequency divided signals; and the second phase comparator detects a phase difference between the third and fourth frequency divided signals.

17. The apparatus according to claim 16, further comprising:

a switching circuit configured to switch whether the phase difference detected by the first phase comparator is supplied to the second control voltage generator.

18. The apparatus according to claim 17, wherein after operation of the first voltage control oscillator is stabilized, the switching circuit shuts down a path between the first phase comparator and the second control voltage generator to prevent the phase difference detected by the first phase comparator from being supplied to the second control voltage generator.

* * * * *

UNITED STATES PATENT AND TRADEMARK OFFICE
CERTIFICATE OF CORRECTION

| | | |
|---|---|---|
| PATENT NO. | : 7,769,352 B2 | Page 1 of 1 |
| APPLICATION NO. | : 11/568365 | |
| DATED | : August 3, 2010 | |
| INVENTOR(S) | : Takashi Kawakubo et al. | |

It is certified that error appears in the above-identified patent and that said Letters Patent is hereby corrected as shown below:

On the title page, Item (86), the Application Filing Date is incorrect. Item (86) should read:

-- (86) PCT No.:   PCT/JP2006/319612

§ 371 (c)(1),
(2), (4) Date: Jan. 3, 2007 --

Signed and Sealed this

Second Day of November, 2010

David J. Kappos
*Director of the United States Patent and Trademark Office*